United States Patent
Koo et al.

(10) Patent No.: US 11,469,391 B2
(45) Date of Patent: Oct. 11, 2022

(54) LIGHT-EMITTING DEVICE AND DISPLAY APPARATUS INCLUDING THE SAME

(71) Applicant: SAMSUNG ELECTRONICS CO., LTD., Suwon-si (KR)

(72) Inventors: Hyun Koo, Seongnam-si (KR); Wonjae Joo, Seongnam-si (KR); Ajeong Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 4 days.

(21) Appl. No.: 17/235,462

(22) Filed: Apr. 20, 2021

(65) Prior Publication Data
US 2022/0158123 A1    May 19, 2022

(30) Foreign Application Priority Data

Nov. 19, 2020   (KR) .................. 10-2020-0155431

(51) Int. Cl.
| | | |
|---|---|---|
| H01L 51/52 | (2006.01) | |
| H01L 27/32 | (2006.01) | |
| H01L 51/50 | (2006.01) | |

(52) U.S. Cl.
CPC ........ *H01L 51/5218* (2013.01); *H01L 27/326* (2013.01); *H01L 51/5092* (2013.01); *H01L 51/5265* (2013.01)

(58) Field of Classification Search
CPC combination set(s) only.
See application file for complete search history.

(56) References Cited

U.S. PATENT DOCUMENTS

| | | |
|---|---|---|
| 10,158,048 B2 | 12/2018 | Kim et al. |
| 10,546,979 B2 | 1/2020 | Chen et al. |
| 10,903,454 B2 | 1/2021 | Joo et al. |
| 10,950,823 B2 | 3/2021 | Kyoung et al. |

(Continued)

FOREIGN PATENT DOCUMENTS

| | | |
|---|---|---|
| KR | 10-2016-0117696 A | 10/2016 |
| KR | 10-2017-0123557 A | 11/2017 |

(Continued)

OTHER PUBLICATIONS

Communication dated Oct. 19, 2021 by the European Patent Office in counterpart European patent Application No. 201170921.7.

*Primary Examiner* — Daniel Whalen
(74) *Attorney, Agent, or Firm* — Sughrue Mion, PLLC

(57) ABSTRACT

A light-emitting device with light emission efficiency and a display apparatus are provided. The light-emitting device includes a first organic light emission material layer generating light of a first wavelength, a second organic light emission material layer generating light of a second wavelength different from the first wavelength, and a third organic light emission material layer generating light of a third wavelength different from the first and second wavelengths, the first organic light emission material layer may be located at a position comprising a first antinode having a resonance wavelength resonating in a micro cavity, and the second organic light emission material layer and the third organic light emission material layer may be located at a position comprising a second antinode having the resonance wavelength resonating in the micro cavity.

20 Claims, 10 Drawing Sheets

(56) References Cited

U.S. PATENT DOCUMENTS

| | | | |
|---|---|---|---|
| 2009/0026921 A1* | 1/2009 | Kuma | H01L 51/5265 |
| | | | 313/504 |
| 2013/0082246 A1 | 4/2013 | Hasegawa | |
| 2013/0153868 A1 | 6/2013 | Wu et al. | |
| 2014/0353635 A1* | 12/2014 | Chou | H01L 51/504 |
| | | | 257/40 |
| 2015/0207091 A1 | 7/2015 | Morimoto et al. | |
| 2019/0198817 A1* | 6/2019 | Joo | H01L 51/5092 |
| 2019/0363274 A1* | 11/2019 | Yoo | H01L 51/5056 |
| 2020/0058905 A1 | 2/2020 | Kyoung et al. | |
| 2021/0288290 A1 | 9/2021 | Lee et al. | |
| 2021/0296616 A1 | 9/2021 | Song et al. | |

FOREIGN PATENT DOCUMENTS

| | | |
|---|---|---|
| KR | 10-2020-0021275 A | 2/2020 |
| KR | 10-2020-0093324 A | 8/2020 |
| KR | 10-2021-0115469 A | 9/2021 |
| KR | 10-2021-0116108 A | 9/2021 |

* cited by examiner

| Emission Type | Distance from ~(nm) | | Red peak intensity | | Blue peak intensity | |
|---|---|---|---|---|---|---|
| | cathode | Anode | intensity | % | intensity | % |
| Bottom | 60nm | 206nm | 0.016 | 100 | 0.019 | 100 |
| Bottom | 70nm | 196nm | 0.022 | 139 | 0.016 | 81 |
| Top | 60nm | 206nm | 0.066 | 425 | 0.070 | 358 |
| Top | 70nm | 196nm | 0.113 | 725 | 0.043 | 219 |

| Mixing degree b/w R/G EML | EQE (%) | | |
|---|---|---|---|
| | Red | Green | Total |
| w/ Buffer 4 nm | 4.07 | 15.76 | 19.83 |
| w/o buffer | 8.52 | 11.96 | 20.48 |
| Half mix | 16.89 | 6.57 | 23.46 |
| Full mix | 18.11 | 3.69 | 21.80 |

LIGHT-EMITTING DEVICE AND DISPLAY APPARATUS INCLUDING THE SAME

CROSS-REFERENCE TO RELATED APPLICATION

This application claims the benefit of Korean Patent Application No. 10-2020-0155431, filed on Nov. 19, 2020 in the Korean Intellectual Property Office, the disclosure of which is incorporated herein by reference in its entirety.

BACKGROUND

1. Field

The present disclosure relates to a light-emitting device and a display apparatus including the light-emitting device, and more particularly to, an organic light-emitting device (OLED) with improved light emission efficiency and an organic light-emitting display apparatus.

2. Description of Related Art

An organic light-emitting device (OLED) is a display apparatus that forms an image via light emission according to a combination of holes supplied from an anode and electrons supplied from a cathode in an organic emission layer. OLEDs have excellent display characteristics such as a wide viewing angle, a fast response speed, a small thickness, low manufacturing costs, and high contrast.

Further, an OLED may emit a wanted color according to selection of an appropriate material as a material of the organic emission layer. According to this principle, it is possible to manufacture a color display apparatus by using an OLED.

SUMMARY

One or more example embodiments provide an organic light-emitting device (OLED) with improved light emission efficiency and an organic light-emitting display apparatus.

Additional aspects will be set forth in part in the description which follows and, in part, will be apparent from the description, or may be learned by practice of the presented embodiments of the disclosure.

According to an aspect of an embodiment, a light-emitting device including: a reflective layer including a plurality of nanostructures; a first electrode disposed on the reflective layer; an organic light emission layer disposed on the first electrode; and a second electrode disposed on the organic light emission layer, wherein the reflective layer and the second electrode may constitute a micro cavity having a resonance wavelength, wherein the organic light emission layer may include a first organic light emission material layer configured to generate a first light of a first wavelength, a second organic light emission material layer configured to generate a second light of a second wavelength different from the first wavelength, and a third organic light emission material layer configured to generate a third light of a third wavelength different from the first and the second wavelengths, wherein the first organic light emission material layer may be disposed at a position of a first antinode of the resonance wavelength, and wherein the second organic light emission material layer and the third organic light emission material layer may be disposed at a position of a second antinode of the resonance wavelength resonating in the micro cavity.

The second organic light emission material layer and the third organic light emission material layer may be adjacent to or mixed with each other to enable energy transfer from a second light-emitting dopant material in the second organic light emission material layer to a third light-emitting dopant material in the third organic light emission material layer.

The second organic light emission material layer may be spaced apart from the first organic light emission material layer between the first organic light emission material layer and the third organic light emission material layer and may be arranged in direct contact with the third organic light emission material layer.

The organic light emission layer may further include: a hole injection layer located between the first electrode and the third organic light emission material layer; a charge generation layer located between the first organic light emission material layer and the second organic light emission material layer; and an electron injection layer located between the first organic light emission material layer and the second electrode.

The second light-emitting dopant material in the second organic light emission material layer and the third light-emitting dopant material in the third organic light emission material layer may be phosphorescent dopant materials, and a first light-emitting dopant material in the first organic light emission material layer is a fluorescent dopant material.

The organic light emission layer may further include a mixture layer of the second organic light emission material layer and the third organic light emission material layer between the second organic light emission material layer and the third organic emission material layer.

The third organic light emission material layer may be partially mixed with the second organic light emission material layer to form a mixture layer, and the mixture layer is below the second organic light emission material layer.

The organic light emission layer may further include a plurality of second organic light emission material layers and a plurality of third organic light emission material layers that are alternately arranged in a direction from the second electrode toward the first electrode.

A thickness of each of the second organic light emission material layers may be greater than a thickness of each of the third organic light emission material layers.

A concentration of the second light-emitting dopant material in the second organic light emission material layer may be higher than a concentration of the third light-emitting dopant material in the third organic light emission material layer.

The organic light emission layer may further include an additional first organic light emission material layer arranged at a position of a third antinode of the resonance wavelength.

The organic light emission layer may further include a charge generating layer disposed between the additional first organic light emission material layer and the third organic light emission material layer.

A width of each of the plurality of nanostructures of the reflective layer, a height of each of the plurality of nanostructures, and a period of the plurality of nanostructures may be set such that the resonance wavelength of the micro cavity coincides with the second wavelength or the third wavelength.

The period of the plurality of nanostructures may be smaller than the resonance wavelength of the micro cavity.

The first electrode may be a transparent electrode, and the second electrode may be a semi-transmissive electrode that reflects a part of light and transmits a remaining part of the light.

According to an aspect of another embodiment, there is provided a display apparatus including: a first pixel configured to emit a first light of a first wavelength; a second pixel configured to emit a second light of a second wavelength different from the first wavelength; and a third pixel configured to emit a third light of a third wavelength different from the first and second wavelengths, wherein at least one of the first, the second, and the third pixels may include: a reflective layer including a plurality of nanostructures; a first electrode disposed on the reflective layer; an organic light emission layer disposed on the first electrode; and a second electrode disposed on the organic light emission layer. When the at least one of the first, the second, and the third pixels include the second pixel, the reflective layer and the second electrode that are included in the second pixel, may constitute a micro cavity resonating the second light of the second wavelength. The organic light emission layer may include a first organic light emission material layer configured to generate the first light of the first wavelength, a second organic light emission material layer configured to generate the second light of the second wavelength, and a third organic light emission material layer configured to generate the third light of the third wavelength. The first organic light emission material layer may be disposed at a position of a first antinode of a resonance wavelength resonating in the micro cavity. The second organic light emission material layer and the third organic light emission material layer may be disposed at a position of a second antinode of the resonance wavelength.

The second organic light emission material layer and the third organic light emission material layer may be adjacent to or mixed with each other to enable energy transfer from a second light-emitting dopant material in the second organic light emission material layer to a third light-emitting dopant material in the third organic light emission material layer.

The second organic light emission material layer may be spaced apart from the first organic light emission material layer between the first organic light emission material layer and the third organic light emission material layer and may be arranged in direct contact with the third organic light emission material layer.

The organic light emission layer may further include: a hole injection layer disposed between the first electrode and the third organic light emission material layer; a charge generation layer disposed between the first organic light emission material layer and the second organic light emission material layer; and an electron injection layer disposed between the first organic light emission material layer and the second electrode.

The second light-emitting dopant material in the second organic light emission material layer and the third light-emitting dopant material in the third organic light emission material layer may be phosphorescent dopant materials, and a first light-emitting dopant material in the first organic light emission material layer may be a fluorescent dopant material.

The organic light emission layer may further include a mixture layer of the second organic light emission material layer and the third organic light emission material layer between the second organic light emission material layer and the third organic light emission material layer.

The third organic light emission material layer may be mixed with the second organic light emission material layer to form a mixture layer, and the mixture layer may be disposed below the second organic light emission material layer.

The organic light emission layer may include a plurality of second organic light emission material layers and a plurality of third organic light emission material layers alternately arranged in a direction from the second electrode toward the first electrode.

A thickness of each of the second organic light emission material layers may be greater than a thickness of each of the third organic light emission material layers.

A concentration of the second light-emitting dopant material in the second organic light emission material layer may be higher than a concentration of the third light-emitting dopant material in the third organic light emission material layer.

The display apparatus may further include an additional first organic light emission material layer disposed at a position of a third antinode of the resonance wavelength.

The organic light emission layer may further include a charge generating layer disposed between the additional first organic light emission material layer and the third organic light emission material layer.

A width of each of the plurality of nanostructures of the reflective layer, a height of each of the plurality of nanostructures, and a period of the plurality of nanostructures may be set such that the micro cavity resonates the second light of the second wavelength.

The at least one of the first, the second, and the third pixels may include the third pixel. The reflective layer and the second electrode that are included in the third pixel, may constitute a third micro cavity resonating the third light of the third wavelength.

The at least one of the first, the second, and the third pixels may include the first pixel, and the reflective layer and the second electrode that are included in the first pixel, may constitute a first micro cavity resonating the first light of the first wavelength.

A physical thickness of the first pixel, a physical thickness of the second pixel, and a physical thickness of the third pixel may be equal to each other.

According to an aspect of another embodiment, there is provided a display apparatus including a plurality of pixels, wherein at least one of the plurality of pixels may include: an organic light emission layer disposed between a first electrode and a second electrode, and including: a first organic light emission material layer including a first light-emitting dopant material, without a second light-emitting dopant material and a third light-emitting dopant material; a second organic light emission material layer including the second light-emitting dopant material, without the first light-emitting dopant material and the third light-emitting dopant material; a third organic light emission material layer including the third light-emitting dopant material without the first light-emitting dopant material and the second light-emitting dopant material; and a mixture layer that is formed by the second light-emitting dopant material being mixed with the third light-emitting dopant material when the second organic light emission material layer is directly in contact with the third organic light emission material layer, and that is disposed between the second organic light emission material layer and the third organic light emission material layer; and a reflective layer which includes a plurality of nanostructures, and on which the first electrode, the organic light emission layer, and the second electrode are disposed.

BRIEF DESCRIPTION OF THE DRAWINGS

The above and/or other aspects will be more apparent by describing certain example embodiments, with reference to the accompanying drawings, in which.

DETAILED DESCRIPTION

Figure 1:
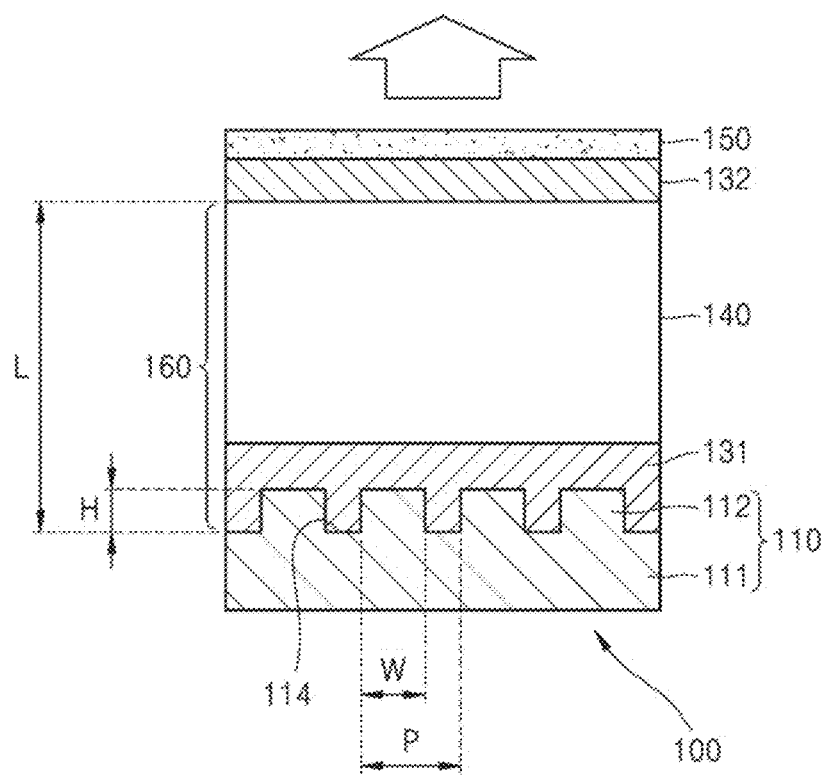
FIG. 1 is a cross-sectional view schematically showing a structure of a light-emitting device according to an example embodiment.

Example embodiments are described in greater detail below with reference to the accompanying drawings.

In the following description, like drawing reference numerals are used for like elements, even in different drawings. The matters defined in the description, such as detailed construction and elements, are provided to assist in a comprehensive understanding of the example embodiments. However, it is apparent that the example embodiments can be practiced without those specifically defined matters. Also, well-known functions or constructions are not described in detail since they would obscure the description with unnecessary detail.

As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, all of a, b, and c, or any variations of the aforementioned examples.

While such terms as "first," "second," etc., may be used to describe various elements, such elements must not be limited to the above terms. The above terms may be used only to distinguish one element from another.

In a layer structure described below, an expression "above" or "on" may include not only "immediately on in a contact manner" but also "on in a non-contact manner". An expression used in the singular encompasses the expression of the plural, unless it has a clearly different meaning in the context. It will be further understood that the terms "comprises" and/or "comprising" used herein specify the presence of stated features or elements, but do not preclude the presence or addition of one or more other features or elements.

The use of "the" and other demonstratives similar thereto may correspond to both a singular form and a plural form. Unless the order of operations of a method according to the present disclosure is explicitly mentioned or described otherwise, the operations may be performed in a proper order. The present disclosure is not limited to the order the operations are mentioned.

The term used in the embodiments such as "unit" or "module" indicates a unit for processing at least one function or operation, and may be implemented in hardware or software, or in a combination of hardware and software.

The connecting lines, or connectors shown in the various figures presented are intended to represent functional relationships and/or physical or logical couplings between the various elements. It should be noted that many alternative or additional functional relationships, physical connections or logical connections may be present in a practical device.

The use of any and all examples, or language provided herein, is intended merely to better illuminate the disclosure and does not pose a limitation on the scope of the disclosure unless otherwise claimed.

FIG. 1 is a cross-sectional view schematically showing a structure of a light-emitting device 100 according to an example embodiment. Referring to FIG. 1, the light-emitting device 100 may include a reflective layer 110 including a plurality of nanostructures 112 that are periodically two-dimensionally arranged, a first electrode 131 disposed on the reflective layer 110, an organic light emission layer 140 disposed on the first electrode 131, and a second electrode 132 disposed on the organic light emission layer 140. The light-emitting device 100 may further include a passivation layer 150 disposed on the second electrode 132 to protect the second electrode 132.

The first electrode 131 disposed on the lower surface of the organic light emission layer 140 may serve as an anode that provides holes. The second electrode 132 disposed on the upper surface of the organic light emission layer 140 may serve as a cathode that provides electrons. To this end, the first electrode 131 may include a material having a relatively high work function, and the second electrode 132 may include a material having a relatively low work function.

In addition, the first electrode 131 may be a transparent electrode having a property of transmitting light (e.g., visible light). For example, the first electrode 131 may include transparent conductive oxide, such as indium tin oxide (ITO), indium zinc oxide (IZO), or aluminum zinc oxide (AZO).

The second electrode 132 may be a semi-transmissive electrode that reflects part of light and transmits the remaining part thereof. To this end, the second electrode 132 may include a very thin reflective metal. For example, the second electrode 132 may include silver (Ag), aluminum (Al), gold (Au), nickel (Ni), or an alloy thereof or may have a double layer structure of silver (Ag) and magnesium (Mg) or a multilayer structure of aluminum (Al) and lithium (Li). The entire thickness of the second electrode 132 may be about 10 nm to about 50 nm. Because the thickness of the second electrode 132 is very thin, part of light may pass through the reflective metal.

The reflective layer 110 may be configured to reflect light generated from the organic light emission layer 140 and transmitted through the first electrode 131. In addition, the reflective layer 110 may include a material having conductivity. To this end, the reflective layer 110 may include silver (Ag), gold (Au), aluminum (Al), or an alloy including silver (Ag), gold (Au), and aluminum (Al). However, the reflective layer 110 is not necessarily limited thereto, and may include other reflective materials as long as the reflective layer 170 has high reflectivity and conductivity.

The reflective layer 110 may configure a micro cavity 160 together with the second electrode 132. In other words, the micro cavity 160 may be formed between the reflective layer 110 and the second electrode 132 of the light-emitting device 100. For example, light generated from the organic light emission layer 140 may reciprocate and resonate between the reflective layer 110 and the second electrode 132, and then light corresponding to the resonance wavelength of the micro cavity 160 may be emitted to the outside of the light-emitting device 100 through the second electrode 132.

The resonance wavelength of the micro cavity 160 formed between the reflective layer 110 and the second electrode 132 may be proportional to an optical length L of the micro cavity 160. For example, when the resonance wavelength of the micro cavity 160 is $\lambda$, the optical length L of the micro cavity 160 may be $n\lambda/2$ (n is a natural number). The optical length L of the micro cavity 160 may be determined as the sum of the optical thickness of layers forming the micro cavity 160 between the reflective layer 110 and the second electrode 132, a phase delay by the second electrode 132, and a phase shift (e.g., a phase delay) by the reflective layer 110. Here, the optical thickness of the layers forming the micro cavity 160 between the reflective layer 110 and the second electrode 132 may not be the same as the physical thickness of the layers forming the micro cavity 160. An optical thickness of a layer means the product of a physical thickness of the layer and a refractive index of the layer. For example, the optical thickness of the layers forming the micro cavity 160 may be the sum of the optical thickness of the first electrode 131 and the optical thickness of the organic light emission layer 140.

According to the present example embodiment, the optical length L of or the resonance wavelength of the micro cavity 160 may be adjusted by adjusting only the phase shift by the reflective layer 110 while fixing the optical thickness of the layers forming the micro cavity 160 and the phase delay by the second electrode 132. In order to control the phase shift by the reflective layer 110, a phase modulation surface may be formed on the reflective surface of the reflective layer 110 in contact with the first electrode 131. The phase modulation surface may include very small patterns in the nanoscale. For example, the phase modulation surface of the reflective layer 110 may have a meta structure in which nano patterns having a size smaller than the wavelength of visible light are periodically disposed.

Referring to FIG. 1, the reflective layer 110 may include a base 111 and the phase modulation surface formed on an upper surface 114 of the base 111. The phase modulation surface of the reflective layer 110 may include a plurality of nanostructures 112 periodically arranged on the upper surface 114 of the base 111. The plurality of nanostructures 112 may have a post shape protruding from the upper surface 114 of the base 111 toward the first electrode 131. For example, the plurality of nanostructures 112 may have a cylindrical shape. The plurality of nanostructures 112 may be integrally formed with the base 111. The reflective layer 110 may be disposed such that an upper surface of the plurality of nanostructures 112 is in contact with the first electrode 131.

The optical characteristics of the phase modulation surface may be determined by a critical dimension W of each of the nanostructures 112, the height H of each of the nanostructures 112, and the pitch or the period P of the plurality of nanostructures 112. For example, when each of the nanostructures 112 is a cylinder, the critical dimension W of each of the nanostructures 112 may be a diameter of each of the nanostructures 112. The diameter of the cylinder may be also referred to as a width. In addition, when each of the nanostructures 112 is a polygonal column, the critical dimension W of each of the nanostructures 112 may be a maximum width of each of the nanostructures 112.

The critical dimension W, the height H, and the period P of the nanostructures 112 may be constant with respect to the entire region of the phase modulation surface. For example, the critical dimension W of the nanostructure 112 is from about 30 nm to about 250 nm, the height H of the nanostructure 112 is from about 0 nm to about 150 nm, and the period P of the plurality of nanostructures 112 may be from about 100 nm to about 300 nm.

When the size of each of the nanostructures 112 of the phase modulation surface is smaller than the resonance wavelength as described above, a plurality of nano-light resonance structures may be formed while incident light resonates in the periphery of the nanostructures 112. In particular, in the incident light, an electric field component may not penetrate into a space between the nanostructures 112, and only a magnetic field component may resonate in the periphery of the nanostructures 112. Accordingly, a plurality of nano-light resonant structures formed in the space between the nanostructures 112 may be a cylinder type magnetic resonator in which the magnetic field component of the incident light resonates in the periphery of the nanostructures 112. As a result, a phase shift greater than a simple phase shift due to an effective optical distance (H×n) determined by the product of the height H of the nanostructures 112 and a refractive index n of the nanostructures 112 may occur on the phase modulation surface of the reflective layer 110.

Accordingly, the resonance wavelength of the micro cavity 160 may be determined by the critical dimension W of each of the nanostructures 112 of the phase modulation surface, the height H of each of the nanostructures 112 and the period P of the plurality of nanostructures 112. In other words, when the resonance wavelength of the micro cavity 160 is λ, the critical dimension W of each of the nanostructures 112 of the phase modulation surface, the height H of each of the nanostructures 112 and the period P of the plurality of nanostructures 112 of the phase modulation surface may be selected such that the optical length L of the micro cavity 160 is nλ/2 (n is a natural number).

Then, the resonance wavelength of the micro cavity 160 may easily match with the emitting wavelength or emitting color of the light-emitting device 100. For example, when the light-emitting device 100 is a red light-emitting device, the critical dimension W of each of the nanostructures 112 of the phase modulation surface, the height H of each of the nanostructures 112 and the period P of the plurality of nanostructures 112 of the phase modulation surface may be selected such that the resonance wavelength of the micro cavity 160 corresponds to a red wavelength band. As described above, it may be possible to determine the emitting wavelength of the light-emitting device 100 only by the structure of the phase modulation surface of the reflective layer 110 while fixing a physical length of the micro cavity 160 and an internal structure of the organic light emission layer 140.

Figure 2:
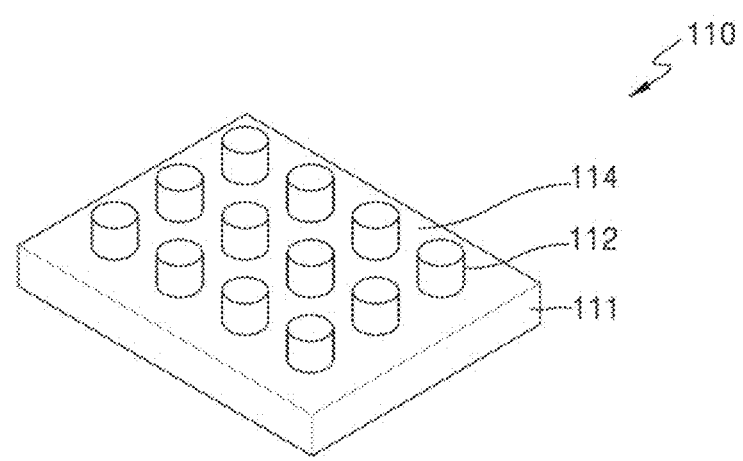
FIG. 2 is a perspective view schematically showing an example structure of a reflective layer illustrated in FIG. 1.
Figure 3:
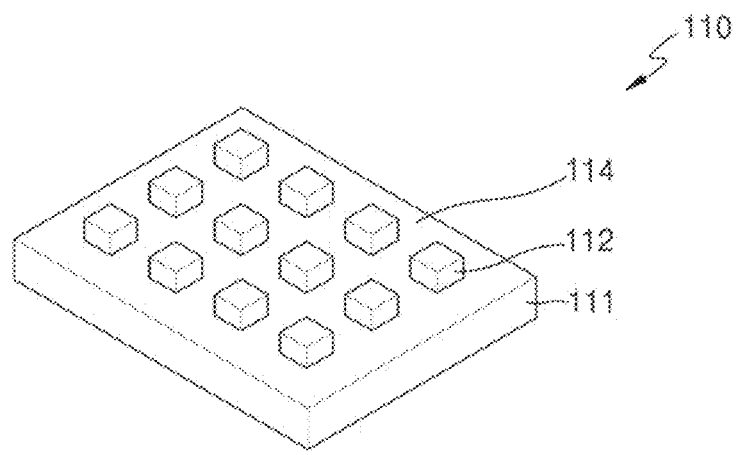
FIG. 3 is a perspective view schematically showing another example structure of a reflective layer illustrated in FIG. 1.

In order to prevent the micro cavity 160 from having a polarization dependency, the plurality of nanostructures 112 may be regularly and periodically arranged to have a 4-fold symmetry characteristic. When the micro cavity 160 has the polarization dependency, only light of a specific polarization component may resonate, which may deteriorate the light emission efficiency of the light-emitting device 100. For example, FIG. 2 is a perspective view schematically showing an example structure of the reflective layer 110 illustrated in FIG. 1, and FIG. 3 is a perspective view schematically showing another example structure of the reflective layer 110 illustrated in FIG. 1. Referring to FIG. 2, the plurality of nanostructures 112 having a cylindrical shape on the upper surface 114 of the base 111 may be regularly arranged two-dimensionally. In addition, referring to FIG. 3, the plurality of nanostructures 112 having a square column shape may be regularly arranged two-dimensionally on the upper surface 114 of the base 111. In FIGS. 2 and 3, although the nanostructure 112 has the cylindrical shape and the square column shape, the shape of the nanostructure 112 is not necessarily limited thereto. For example, the nanostructure 112 may have an elliptical column or a polygonal column shape of a pentagonal shape or more.

Figure 4:
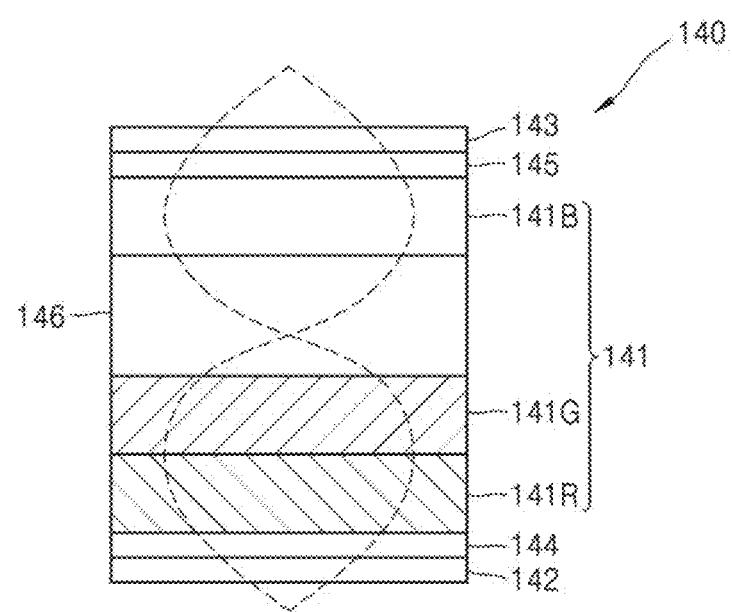
FIG. 4 is a cross-sectional view showing a structure of an organic light emission layer according to an example embodiment.
Figures 5, 6:
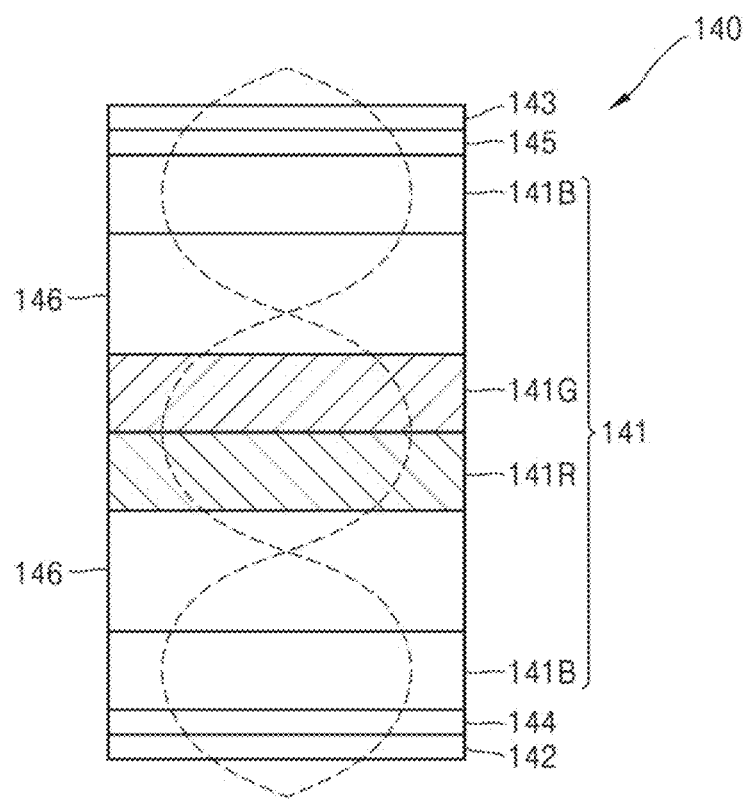
FIG. 5 is a table showing changes in light emission characteristics of an organic light emission material layer according to a position in an organic light emission layer.
FIG. 6 is a cross-sectional view showing a structure of an organic light emission layer according to another example embodiment.

In addition, in FIGS. 4 and 5, the plurality of nanostructures 112 is arranged in a regular two-dimensional array pattern. In this case, intervals between the two adjacent nanostructures 112 in the entire region of a phase modulation surface may be constant. However, if the plurality of nanostructures 112 has a 4-fold symmetry characteristic, the plurality of nanostructures 112 may be arranged in any other type of array. For example, the plurality of nanostructures 112 may be arranged irregularly. In this case, the micro cavity 160 may not also have a polarization dependency. Meanwhile, in another example embodiment, the arrangement of the plurality of nanostructures 112 may be designed differently from the 4-fold symmetry such that the light-emitting device 100 intentionally emits only light of a specific polarization component. For example, the plurality of nanostructures 112 may be arranged in a one-dimensional array pattern.

The light-emitting device 100 may be an organic light-emitting diode (OLED). To this end, the organic light emission layer 140 may include an organic light-emitting material. For example, FIG. 4 is a cross-sectional view showing an example structure of the organic light emission layer 140 illustrated in FIG. 1 in more detail. Referring to FIG. 4, the organic light emission layer 140 may include a hole injection layer 142 disposed on the first electrode 131, an organic light emission material layer 141 disposed on the hole injection layer 142, and an electron injection layer 143 disposed on the organic light emission material layer 141. In this structure, holes provided through the hole injection layer 142 and electrons provided through the electron injection layer 143 may combine in the organic light emission material layer 141 to generate light. A wavelength of the generated light may be determined according to an energy band gap of a light-emitting material of the organic light emission material layer 141.

In addition, the organic light emission layer 140 may further include a hole transfer layer 144 disposed between the hole injection layer 142 and the organic light emission material layer 141 in order to further facilitate the transport of holes. In addition, the organic light emission layer 140 may further include an electron transfer layer 145 disposed between the electron injection layer 143 and the organic light emission material layer 141 in order to further facilitate the transport of electrons. In addition, the organic light emission layer 140 may include various additional layers as necessary. For example, the organic light emission layer 140 may further include an electron block layer between the hole transfer layer 144 and the organic light emission material layer 141, and may also further include a hole block layer between the organic light emission material layer 141 and the electron transfer layer 145.

The organic light emission material layer 141 may be configured to emit visible light. For example, the organic light emission material layer 141 may be configured to emit visible light including all of red light, green light, and blue light. In this case, as described above, an emission wavelength emitted from the light-emitting device 100 may be selected by determining a resonance wavelength of the micro cavity 160 based on the phase modulation by the phase modulation surface of the reflective layer 110.

To emit the visible light including all of red light, green light, and blue light, the organic light emission material layer 141 may include a first organic light emission material layer 141B that generates light of a first wavelength, a second organic light emission material layer 141G that generates light of a second wavelength different from the first wavelength, and a third organic light emission material layer 141R that generates light of a third wavelength different from the first and second wavelengths. For example, the light of the first wavelength may be blue light, the light of the second wavelength may be green light, and the light of the third wavelength may be red light. In this case, the first organic light emission material layer 141B may be doped with a light-emitting dopant material emitting the blue light, the second organic light emission material layer 141G may be doped with a light-emitting dopant material emitting the green light, and the third organic light emission material layer 141R may be doped with a light-emitting dopant material emitting the red light.

Meanwhile, in a cavity structure, a radiative decay rate of a light source in the cavity changes under the influence of a Q-factor and mode volume of the cavity, which is called the Purcell effect. When the Purcell effect is enhanced, the radiative decay rate of the light source may be accelerated and a spontaneous emission rate may be improved. In addition, considering Fermi's golden rule, in order to enhance the Purcell effect, in principle, a high Q-factor, a highly oriented dopant material in an organic light emission material layer, and optimization of the position of the organic light emission material layer may be adjusted. In particular, in order to optimize the position of the organic light emission material layer, organic light emission layers may be located at a position where the electric field strength of a resonance wavelength resonating in the micro cavity 160 is the maximum, that is, in an antinode of the resonance wavelength resonating in the micro cavity 160.

FIG. 5 is a table showing changes in light-emitting characteristics of an organic light emission material layer according to a position in the organic light emission layer 140. The table of FIG. 5 is a result of light-emitting characteristics of a red organic light emission material layer disposed at a distance of 60 nm and 70 nm from the second electrode 132 which is a cathode and light-emitting characteristics of a blue organic light emission material layer disposed at a distance of 60 nm and 70 nm from the second electrode 132. In addition, in the table of FIG. 5, the emission type 'bottom' represents a lower emission structure in which light is emitted downward through the first electrode 131 without resonance because there is no reflective layer below the first electrode 131, and the emission type 'top' represents an upper emission structure in which light is emitted upward through the second electrode 132 after resonance occurs because the reflective layer 110 is below the first electrode 131. A phase modulation effect is not considered due to a phase modulation surface of the reflective layer 110, and it is assumed that the second electrode 132 is Ag and a phase delay due to the second electrode 132 is 1.3π. In addition, it is assumed that an antinode of a blue wavelength is at a distance of 42 nm from the second electrode 132, an antinode of a green wavelength is at a distance of 55 nm from the second electrode 132, and an antinode of a red wavelength is at a distance of 70 nm from the second electrode 132.

Referring to the table of FIG. 5, it may be seen that in the lower emission structure in which resonance does not occur, a peak intensity of red light and a peak intensity of blue light are significantly low compared to the upper emission structure in which resonance occurs. In addition, in both the lower emission structure and the upper emission structure, the peak intensity of red light significantly increases when the red organic light emission material layer is at a distance of 70 nm from the second electrode 132 than at a distance of 60 nm, and the peak intensity of blue light is greatly reduced when the blue organic light emission material layer is at a distance of 70 nm from the second electrode 132 than at a distance of 60 nm. Accordingly, it may be seen that the light emission efficiency varies greatly according to the position of the organic light emission material layer.

Referring back to FIG. 4, a dotted line in FIG. 4 represents an example resonance wavelength that resonates between the reflective layer 110 and the second electrode 132. In the example of FIG. 4, a resonator length of the micro cavity 160 is selected to have a secondary resonance mode in which two antinodes exist in the micro cavity 160. In this case, the first organic light emission material layer 141B may be located at a position including a first antinode of a resonance wavelength resonating in the micro cavity 160, and both the second organic light emission material layer 141G and the third organic light emission material layer 141R may be located at a position including a second antinode of a resonance wavelength resonating in the micro cavity 160.

According to the present example embodiment, because the resonance wavelength of the micro cavity 160 changes only by a phase modulation by a phase modulation surface of the reflective layer 110 while a physical length of the micro cavity 160 is fixed, regardless of a length change of the resonance wavelength, the position of the antinode in the micro cavity 160 may remain almost constant. As a result, regardless of the emission wavelength of the light-emitting device 100, the first organic light emission material layer 141B may be disposed to include the first antinode, and the second organic light emission material layer 141G and the third organic light emission material layer 141R may be disposed to include the second antinode together. Accordingly, when the phase modulation surface of the reflective layer 110 is configured such that the light-emitting device 100 emits blue light, the light emission efficiency of the first organic light emission material layer 141B generating blue light may increase, and when the phase modulation surface of the reflective layer 110 is configured such that the light-emitting device 100 emits green light or red light, the light emission efficiency of the second organic light emission material layer 141G generating green light and the light emission efficiency of the third organic light emission material layer 141R generating red light may increase.

Meanwhile, the organic light emission layer 140 may further include a charge generation layer 146 disposed between the first organic light emission material layer 141B and the second organic light emission material layer 141G. The charge generation layer 146 may facilitate charge transfer between the first organic light emission material layer 141B and the second organic light emission material layer 141G. In addition, the charge generation layer 146 may serve as a spacer layer to adjust the position of the first organic light emission material layer 141B, the position of the second organic light emission material layer 141G and the position of the third organic light emission material layer 141R. For example, by adjusting the thickness of the charge generation layer 146, the first organic light emission material layer 141B may be located at a position including the first antinode, and the second organic light emission material layer 141G and the third organic light emission material layer 141R may be located at a position including the second antinode.

The second organic light emission material layer 141G may be disposed between the first organic light emission material layer 141B and the third organic light emission material layer 141R and may be spaced apart from the first organic light emission material layer 141B by the charge generation layer 146. In this structure, the hole injection layer 142 is disposed between the first electrode 131 and the third light organic emission material layer 141R, and the electron injection layer 143 is disposed between the first organic light emission material layer 141B and the second electrode 132.

FIG. 6 is a cross-sectional view showing a structure of the organic light emission layer 140 according to another example embodiment. In the example of FIG. 6, the resonator length of the micro cavity 160 is selected to have a third-order resonance mode in which three antinodes exist in the micro cavity 160. In this case, the organic light emission layer 140 may further include an additional first organic light emission material layer 141B located at a position including a third antinode of the resonance wavelength resonating in the micro cavity 160. In addition, the organic light emission layer 140 may further include a charge generation layer 146 disposed between the additional first organic light emission material layer 141B and the third organic light emission material layer 141R. A position of the additional first organic light emission material layer 141B may be adjusted through a thickness of the charge generation layer 146 disposed between the additional first organic light emission material layer 141B and the third organic light emission material layer 141R. The third organic light emission material layer 141R may be spaced apart from the additional first organic light emission material layer 141B by the charge generation layer 146. In the structure shown in FIG. 6, the hole injection layer 142 may be disposed between the first electrode 131 and the additional first organic light emission material layer 141B.

The second organic light emission material layer 141G and the third organic light emission material layer 141R may be disposed adjacent to each other or mixed to enable an energy transfer from a light-emitting dopant material in the second organic emission material layer 141G to a light-emitting dopant material in the third organic light emission material layer 141R. For example, in FIGS. 4 and 6, it is shown that the second organic light emission material layer 141G is disposed in direct contact with the third organic light emission material layer 141R without a gap. In order to transfer energy between the second organic light emission material layer 141G and the third organic light emission material layer 141R, the light-emitting dopant material in the second organic light emission material layer 141G and the light-emitting dopant material in the third organic light emission material layer 141R may be phosphorescence dopant materials. Meanwhile, the light-emitting dopant material in the first organic light emission material layer 141B may be a fluorescence dopant material. When the light-emitting dopant material in the first organic light emission material layer 141B is also the phosphorescence dopant material, the first organic light emission material layer 141B may be disposed adjacent to or mixed with the second organic light emission material layer 141G or the third organic light emission material layer 141R, or all of the first to third organic light emission material layers 141B, 141G, and 141R may be disposed adjacent to or mixed with each other.

Figure 7A:
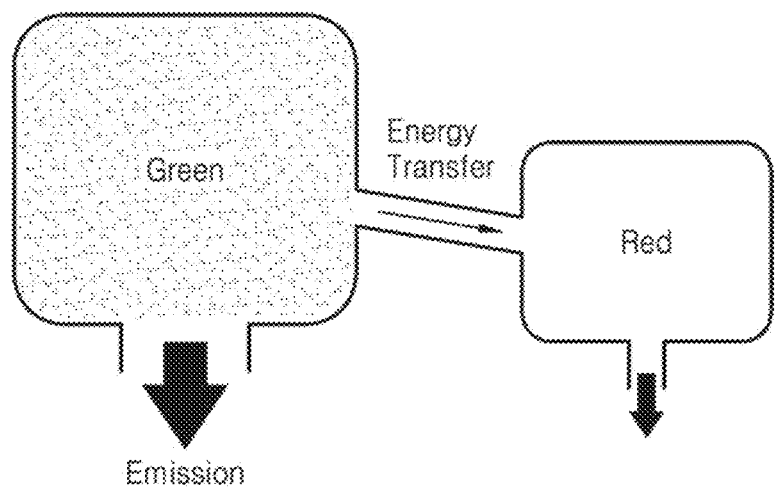
FIGS. 7A and 7B are conceptual diagrams showing energy transfer between different types of light-emitting dopant materials.
Figure 7B:
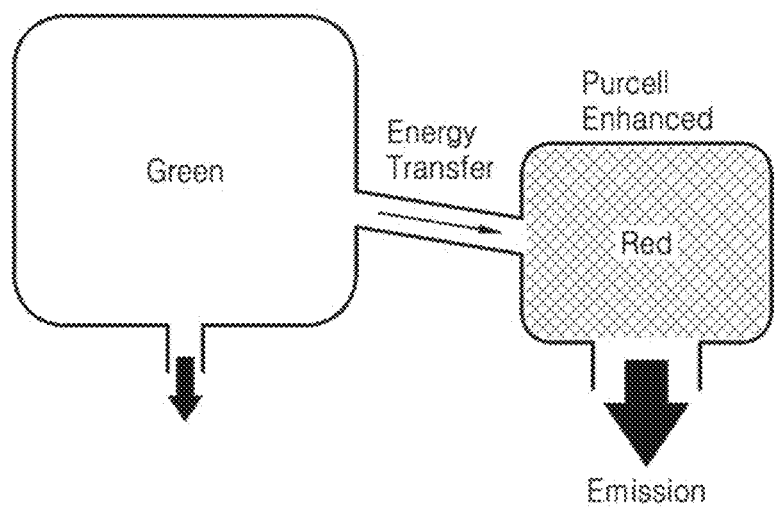

FIGS. 7A and 7B are conceptual diagrams showing an energy transfer between different types of light-emitting dopant materials. In general, a phosphorescence dopant material has a faster radiative decay rate as an emission wavelength increases. In other words, the phosphorescence dopant material rapidly absorbs energy and emit light as the emission wavelength increases. Therefore, the phosphorescence dopant material generating green light absorbs energy more slowly than the phosphorescence dopant material generating red light. When the second organic light emission material layer 141G generating green light and the third organic light emission material layer 141R generating red light are disposed adjacent to each other or are mixed to enable an energy transfer between a light-emitting dopant material in the second organic light emission material layer 141G and a light-emitting dopant material in the third organic light emission material layer 141R, while the second organic light emission material layer 141G absorbs energy and emits green light (FIG. 7A), energy remaining without being absorbed in the second organic light emission material layer 141G may not be wasted but transferred to the third organic light emission material layer 141R such that the third organic light emission material layer 141R may emit red light (FIG. 7B).

Figures 8, 9:
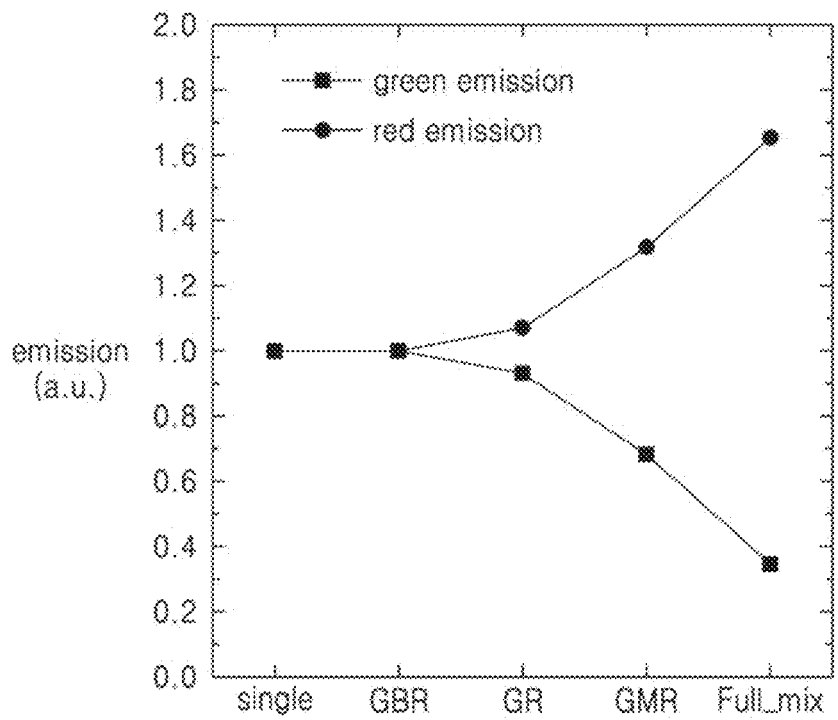
FIG. 8 is a graph showing changes in emission characteristics according to various arrangements between different types of organic light emission material layers.
FIG. 9 is a table showing changes in light emission efficiency according to various arrangements between different types of organic light emission material layers.

FIG. 8 is a graph showing changes in emission characteristics according to various arrangements between different types of organic light emission material layers. In the graph of FIG. 8, a point labeled as 'single' refers to a case where the second organic light emission material layer 141G and the third organic light emission material layer 141R exist independently in separate micro cavities, respectively. In the graph, a point labeled as 'GBR' is a case in which the first organic light emission material layer 141B, the second organic light emission material layer 141G, and the third organic light emission material layer 141R are disposed to be spaced apart from each other in one micro cavity. A point labeled as 'GR' is a case where the second organic light emission material layer 141G and the third organic light emission material layer 141R are disposed in direct contact with each other in one micro cavity, a point labeled as 'GMR' is a case where the second organic light emission material layer 141G and the third organic light emission material layer 141R are partially mixed and disposed in one micro cavity, and a point labeled as 'Full_mix' is a case where the second organic light emission material layer 141G and the third organic light emission material layer 141R are completely mixed and disposed in the same area in one micro cavity. Referring to the graph of FIG. 8, it may be seen that as a degree of mixing between the second light organic emission material layer 141G and the third organic light emission material layer 141R increases, a light-emitting intensity of red light gradually increases and a light-emitting intensity of green light gradually decreases. Such a result occurs because energy is transferred to a phosphorescence dopant material in the third organic light emission material layer 141R as the degree of mixing between the second organic light emission material layer 141G and the third organic light emission material layer 141R increases, before a phosphorescence dopant material in the second organic light emission material layer 141G sufficiently absorbs energy.

Figure 10:
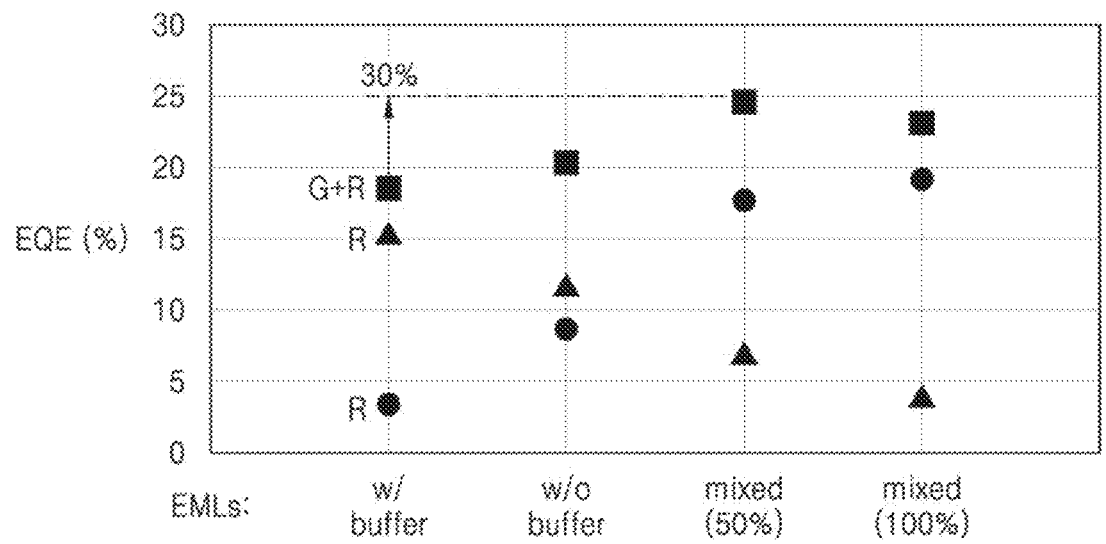
FIG. 10 is a graph showing changes in light emission efficiency according to various arrangements between different types of organic light emission material layers.

FIG. 9 is a table showing changes in a light emission efficiency according to various arrangements between different types of organic light emission material layers, and FIG. 10 is a graph showing changes in a light emission efficiency according to various arrangements between different types of organic light emission material layers. Referring to FIGS. 9 and 10, when the second organic light emission material layer 141G and the third organic light emission material layer 141R are separated from each other by about 4 nm, an external quantum efficiency (EQE) is 4.07% in the third organic light emission material layer 141R, 15.76% in the second organic light emission material layer 141G, and 19.83% as a whole. In addition, when the second organic light emission material layer 141G and the third organic light emission material layer 141R directly contact each other, the EQE is 8.52% in the third organic light emission material layer 141R, 11.96% in the second organic light emission material layer 141G, and 20.48% as a whole. When the second organic light emission material layer 141G and the third organic emission material layer 141R are half-mixed, the EQE is 16.89% in the third organic light emission material layer 141R, 6.57% in the second organic light emission material layer 141G, and 23.46% as a whole. In addition, when the second organic light emission material layer 141G and the third organic light emission material layer 141R are completely mixed, the EQE is 18.11% in the third organic light emission material layer 141R, 3.69% in the second organic light emission material layer 141G, and 21.80% as a whole.

Accordingly, as the degree of mixing between the second organic light emission material layer 141G and the third organic light emission material layer 141R increases, the EQE of the second organic light emission material layer 141G decreases and the EQE of the third organic light emission material layer 141R increases. However, the overall EQE of the second organic light emission material layer 141G and the third organic light emission material layer 141R is the maximum when the second organic light emission material layer 141G and the third organic light emission material layer 141R are half-mixed. For example, the overall EQE when the second organic light emission material layer 141G and the third organic light emission material layer 141R are half mixed increases by about 30% compared to the overall EQE when the second organic light emission material layer 141G and the third organic light emission material layer 141R are separately disposed. Therefore, it may be seen that the overall EQE increases when the second organic light emission material layer 141G and the third organic light emission material layer 141R are partially mixed (at a preset mixing ratio) rather than when the second organic light emission material layer 141G and the third organic light emission material layer 141R are separately disposed, or the second organic light emission material layer 141G and the third organic light emission material layer 141R are completely mixed.

Figure 11:
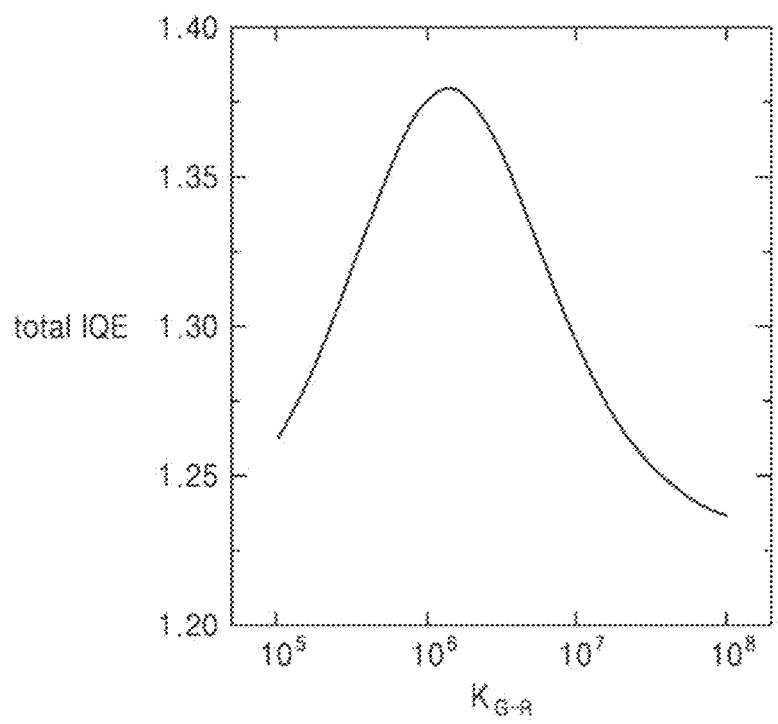
FIG. 11 is a graph showing the relationship between an energy transfer rate and light emission efficiency between different kinds of light-emitting dopant materials.

In addition, FIG. 11 is a graph showing the relationship between an energy transfer rate and a light emission efficiency between different kinds of light-emitting dopant materials. In FIG. 11, $k_{G-R}$ represents an energy transfer rate between a phosphorescence dopant material in the second organic light emission material layer 141G and a phosphorescence dopant material in the third organic light emission material layer 141R. The energy transfer rate decreases as a degree of mixing of the second organic light emission material layer 141G and the third organic light emission material layer 141R decreases, and increases as the degree of mixing increases. Referring to FIG. 11, it may be seen that there is an energy transfer rate at which an overall internal quantum efficiency (IQE) of the second organic light emission material layer 141G and the third organic light emission material layer 141R is maximized.

In view of this, an overall light emission efficiency of the light-emitting device 100 may be further improved by partially mixing the second organic light emission material layer 141G and the third organic light emission material layer 141R at a preset mixing ratio. Although an intensity of green light decreases when the second organic light emission material layer 141G and the third organic light emission material layer 141R are mixed, the intensity of green light actually emitted from the light-emitting device 100 after resonating in a micro cavity does not decrease significantly. In addition, a difference in the intensity of light emitted from the light-emitting device 100 for each wavelength may be compensated by adjusting voltages applied to the first electrode 131 and the second electrode 132. Therefore, it may be seen that the benefit obtained by further improving the overall light emission efficiency of the light-emitting device 100 is greater.

Figure 12:
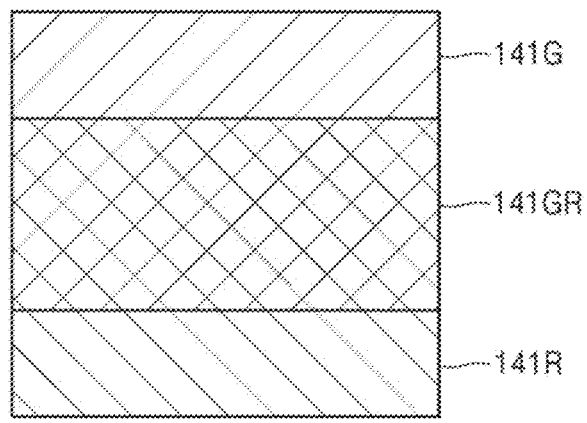
FIGS. 12 to 14 are cross-sectional views showing various arrangement examples between different types of organic light emission material layers according to example embodiments.
Figure 13:
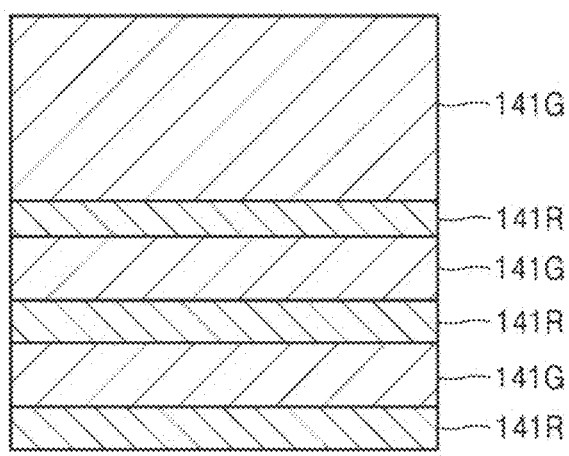
Figure 14:
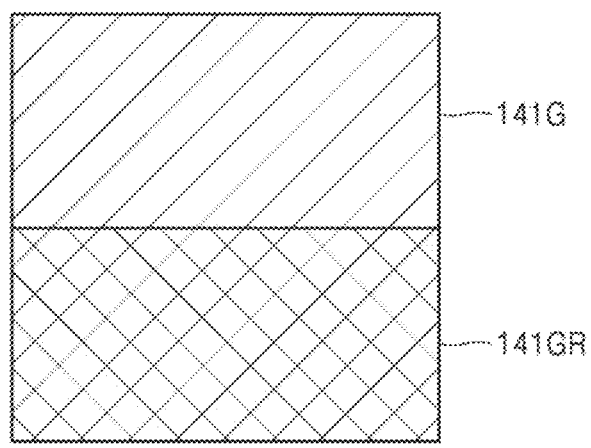

FIGS. 12 to 14 are cross-sectional views showing various arrangement examples between different types of organic light emission material layers. First, referring to FIG. 12, the second organic light emission material layer 141G and the third organic light emission material layer 141R may be partially overlapped. In other words, a mixture layer 141GR of the second organic light emission material layer 141G and the third organic light emission material layer 141R is disposed between the second organic light emission material layer 141G and the third organic light emission material layer 141R. The second organic light emission material layer 141G and the mixture layer 141GR may directly contact each other without a gap, and the mixture layer 141GR and the third organic light emission material layer 141R may also directly contact each other without a gap.

In FIG. 12, only a green light-emitting dopant material is distributed in the second organic light emission material layer 141G, only a red light-emitting dopant material is distributed in the third organic light emission material layer 141R, and the green light-emitting dopant material and the red light-emitting dopant material may be distributed together in the mixture layer 141GR. In consideration of a decrease in the intensity of green light, a concentration of the green light-emitting dopant material in the second organic light emission material layer 141G and the mixture layer 141GR may be higher than a concentration of the red light-emitting dopant material in the third organic light emission material layer 141R and the mixture layer 141GR. For example, the concentration of the green light-emitting dopant material may be about 5% to about 10%, and the concentration of the red light-emitting dopant material may be about 2% to about 3%.

Referring to FIG. 13, a plurality of second organic light emission material layers 141G and a plurality of third organic light emission material layers 141R may be alternately disposed with each other in a direction from the second electrode 132 toward the first electrode 131. The plurality of second organic light emission material layers 141G and the plurality of third organic light emission material layers 141R may directly contact each other without a gap. A thickness of the second organic light emission material layer 141G first disposed in the direction from the second electrode 132 toward the first electrode 131 may be greater than thicknesses of the subsequent plurality of second organic light emission material layers 141G. The thicknesses of the subsequent plurality of second organic light emission material layers 141G may be the same. In addition, thicknesses of the plurality of third organic light emission material layers 141R may be the same. Alternatively, when the structure shown in FIG. 13 is expressed differently, it may be considered that a plurality of thin film third organic light emission material layers 141R are inserted into a lower region of the second organic light emission material layer 141G at regular intervals.

In consideration of the decrease in the intensity of green light, the thickness of each of the second organic light emission material layers 141G may be greater than that of each of the third organic light emission material layers 141R. For example, the thickness of each of the second organic light emission material layers 141G may be about 5 nm to about 10 nm, and the thickness of each of the third organic e light mission material layers 141R may be about 2 nm to about 5 nm. Alternatively, the thickness of each of the second organic light emission material layers 141G and the thickness of each of the third organic light emission material layers 141R may be the same, and the concentration of the green light-emitting dopant material in each of the second organic light emission material layers 141G may be higher than the concentration of the red light-emitting dopant material in each of the third organic light emission material layers 141R.

Referring to FIG. 14, the third organic light emission material layer 141R does not exist alone, but may be mixed with the second organic light emission material layer 141G to form a mixture layer 141GR and disposed in the lower region of the second organic light emission material layer 141G. In other words, the third organic light emission material layer 141R overlaps with the second organic light emission material layer 141G to form the mixture layer 141GR and is disposed in the lower region of the second organic light emission material layer 141G. Accordingly, the mixture layer 141GR of the second organic light emission material layer 141G and the third organic light emission material layer 141R is disposed below the second organic light emission material layer 141G. The second organic light emission material layer 141G and the mixture layer 141GR may directly contact each other without a gap.

Figure 15:
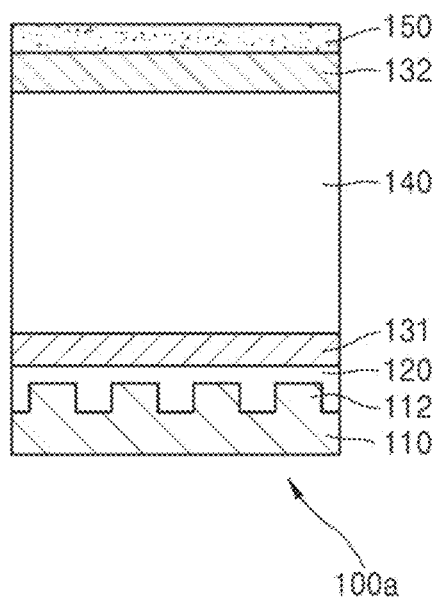
FIG. 15 is a cross-sectional view schematically showing a structure of a light-emitting device according to another example embodiment.

FIG. 15 is a cross-sectional view schematically showing a structure of a light-emitting device 100*a* according to another example embodiment. Referring to FIG. 15, the light-emitting device 100*a* may include the reflective layer 110 including a phase modulation surface, the transparent planarization layer 120 disposed on the reflective layer 110, the first electrode 131 disposed on the planarization layer 120, an organic light emission layer 140 disposed on the first electrode 131, and the second electrode 132 disposed on the organic light emission layer 140. The light-emitting device 100 may further include a passivation layer 150 disposed on the second electrode 132.

In the case of the light-emitting device 100 shown in FIG. 1, because the first electrode 131 is directly disposed on the reflective layer 110, a lower surface of the first electrode 131 may have a shape complementary to the phase modulation surface of the reflective layer 110. In the case of the light-emitting device 100*a* shown in FIG. 15, the planarization layer 120 having an upper surface in a flat planar shape is disposed on the reflective layer 110, and the first electrode 131 is disposed on the planarization layer 120, and thus the lower surface of the first electrode 131 may have the flat planar shape. In this case, the lower surface of the planarization layer 120 has a shape complementary to the phase modulation surface of the reflective layer 110. The planarization layer 120 may include a conductive material or an insulating material.

Figure 16:
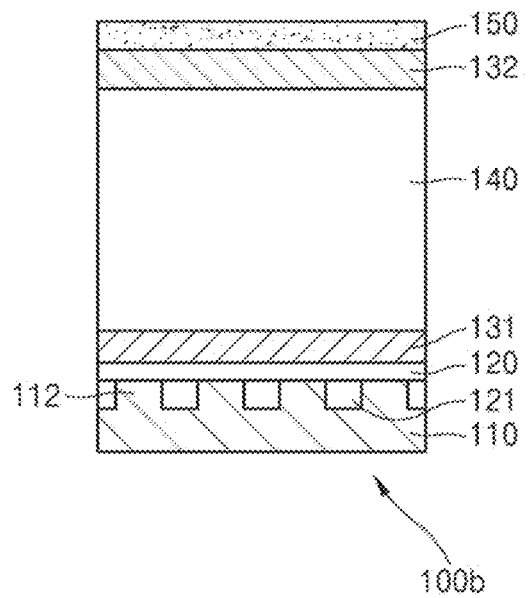
FIG. 16 is a cross-sectional view schematically showing a structure of a light-emitting device according to another example embodiment.

FIG. 16 is a cross-sectional view schematically showing a structure of a light-emitting device 100*b* according to another example embodiment. Referring to FIG. 16, the light-emitting device 100*b* may include the planarization layer 120 having a lower surface and an upper surface in a flat planar shape. In this case, a transparent dielectric 121 may be filled between the plurality of nanostructures 112 of the reflective layer 110. For example, the transparent dielectric 121 may include air as well as at least one of $SiO_2$, $SiN_x$, $Al_2O_3$, and $HfO_2$.

Figure 17:
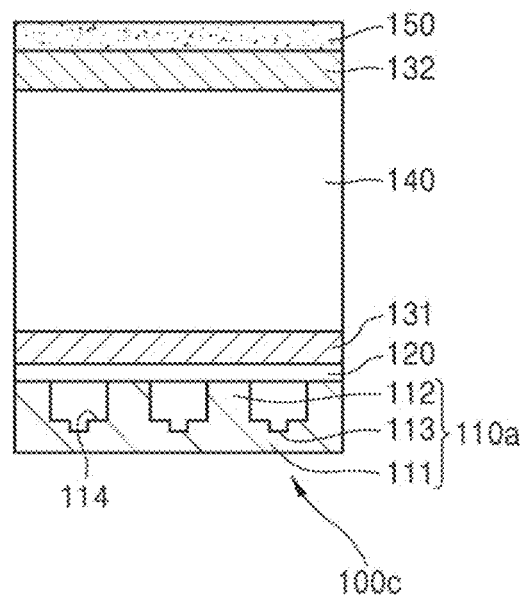
FIG. 17 is a cross-sectional view schematically showing a structure of a light-emitting device according to another example embodiment.

FIG. 17 is a cross-sectional view schematically showing a structure of a light-emitting device 100*c* according to another example embodiment. The light-emitting device 100*c* illustrated in FIG. 17 may include a reflective layer 110*a* having a phase modulation surface different from the phase modulation surface of the reflective layer 110 described above.

Figure 18:
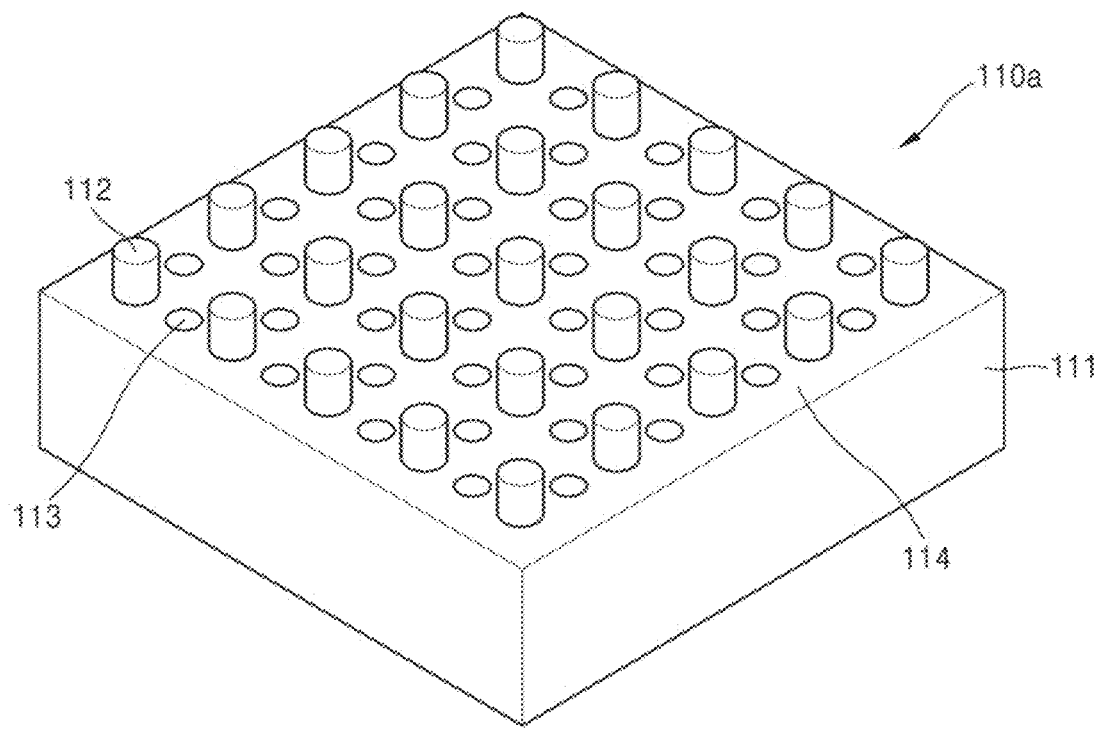
FIG. 18 is a perspective view schematically showing an example structure of a reflective layer illustrated in FIG. 17.

FIG. 18 is a perspective view schematically showing an example structure of the reflective layer 110*a* illustrated in FIG. 17. Referring to FIGS. 17 and 18, the reflective layer 110*a* may include a plurality of nanostructures 112 protruding on the upper surface 114 of the base 111 facing the first electrode 131 and periodically disposed and a plurality of recesses 113 formed by being concavely recessed in the upper surface 114 of the base 111. The upper surface of the plurality of nanostructures 112 may contact the planarization layer 120 or the first electrode 131.

Each of the nanostructures 112 protruding from the upper surface 114 of the base 111 and each of the recesses 113 recessed from the upper surface 114 of the base 111 may have dimensions smaller than the wavelength of visible light. The nanostructures 112 and the recesses 113 may be formed to be spaced apart, and an area occupied by the upper surface 114 may be larger than an area occupied by the plurality of nanostructures 112 or the plurality of recesses 113. In addition, the area occupied by each of the nanostructures 112 may be greater than or equal to the area occupied by each of the recesses 113.

The plurality of nanostructures 112 and the plurality of recesses 113 may be periodically two-dimensionally arranged. As described above, the plurality of nanostructures 112 may serve to adjust the optical length L of the micro cavity 160 to resonate light corresponding to the emitting wavelength of the light-emitting device 100*c*. The plurality of recesses 113 may absorb light having a wavelength that does not require resonance in the micro cavity 160. To this end, the plurality of recesses 113 may have a diameter of about 80 nm to about 250 nm, and may have a depth of about 100 nm or less. The wavelength of the absorbed light may vary according to the diameter of each of the recesses 113. The plurality of recesses 113 of a nano size are disposed on the phase modulation surface of the reflective layer 110*a*, and thus the light having the wavelength that does not require resonance may be additionally absorbed by the recess 213. Accordingly, the color purity of the light-emitting device 100*c* may be improved.

Figure 19:
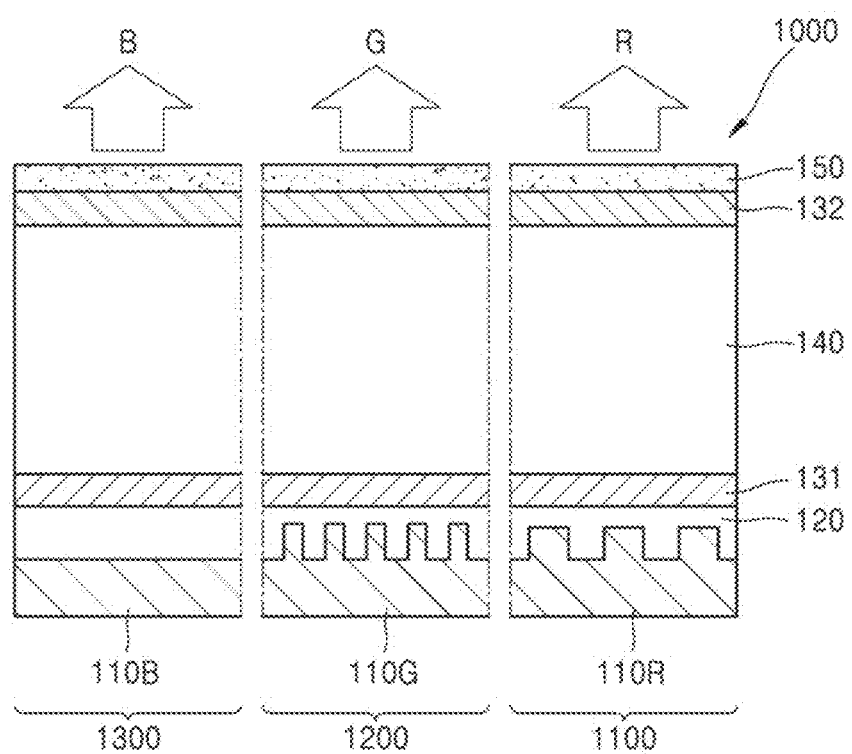
FIG. 19 is a cross-sectional view schematically showing a structure of a display apparatus according to an example embodiment.

The above-described light-emitting devices may be applied to a plurality of pixels of a display apparatus. FIG. 19 is a cross-sectional view schematically showing a structure of a display apparatus 1000 according to an example embodiment. Referring to FIG. 19, the display apparatus 1000 may include a plurality of pixels that emit light of different colors. Here, the plurality of pixels may include red, green, and blue pixels 1100, 1200, and 1300 disposed adjacent to each other on the same plane of a substrate. In FIG. 19, only one unit pixel including the red, green, and blue pixels 1100, 1200, and 1300 is illustrated for convenience, but actually, a very large number of first to third pixels 100B, 100G, and 100R may be repetitively arranged.

The red pixel 1100 is illustrated to have the same structure as the light-emitting device 100*b* illustrated in FIG. 15, but is not limited thereto. The red pixel 1100 may include a first reflective layer 110R, a planarization layer 120 disposed on the first reflective layer 110R, a first electrode 131 disposed on the planarization layer 120, an organic light emission layer 140 disposed on the first electrode 131, and a second electrode 132 disposed on the organic light emission layer 140. The red pixel 1100 may further include a transparent passivation layer 150 disposed on the second electrode 132. The first reflective layer 110R may have a plurality of nanostructures, and may constitute a first micro cavity that resonates the red light R together with the second electrode 132.

The green pixel 1200 is also illustrated to have the same structure as the light-emitting device 100*b* illustrated in FIG. 15, but is not limited thereto. The green pixel 1200 may include a second reflective layer 110G, a planarization layer 120 disposed on the second reflective layer 110G, the first electrode 131 disposed on the second planarization layer 120, the organic light emission layer 140 disposed on the first electrode 131, the second electrode 132 disposed on the organic light emission layer 140, and the passivation layer 150 disposed on the second electrode 132. The second reflective layer 110G may have a plurality of nanostructures, and may constitute a second micro cavity that resonates the green light G together with the second electrode 132.

The blue pixel 1300 may include a third reflective layer 110B, a planarization layer 120 disposed on the third reflective layer 110B, a first electrode 131 disposed on the planarization layer 120, the organic light emission layer 140 disposed on the first electrode 131, the second electrode 132 disposed on the organic light emission layer 140, and the passivation layer 150 disposed on the second electrode 132 An upper surface of the third reflective layer 110B in the blue pixel 1300 may include a flat reflective surface. The third reflective layer 110B may form a third micro cavity that resonates blue light together with the second electrode 132. For example, an optical length of the third micro cavity of the blue pixel 1300 may be determined as the sum of optical lengths of materials disposed between the third reflective layer 110B and the second electrode 132.

Because an emission spectrum may be determined according to the arrangement of nanostructures of the first and second reflective layers 110R and 110G in the above-described display apparatus 1000, physical thicknesses of the red, green, and blue pixels 1100, 1200, and 1300 may be the same. For example, in the red, green, and blue pixels 1100, 1200, and 1300, all structures and physical thicknesses of the first electrode 131, the organic light emission layer 140, the second electrode 132, and the passivation layer 150 may be the same. Therefore, it is not necessary to form the first electrode 131, the organic light emission layer 140, the second electrode 132, and the passivation layer 150 differently for each pixel, thereby easily manufacturing the display apparatus 1000. In particular, it is easy to increase the area of the display apparatus 1000.

The above-described light-emitting device and display apparatus may be applied to devices of various sizes and various uses without limitation. For example, the above-described light-emitting device and display apparatus may be applied to a display panel of a mobile phone or a smart phone, may be applied to a display panel of a tablet or smart tablet, may be applied to a display panel of a notebook computer, television, or smart television, or may be applied to a small display panel used in a head mounted display, a glasses type display, a goggle type display, etc.

The above-described light-emitting device and display apparatus including the same have been described with reference to the example embodiments shown in the drawings, but this is only exemplary. The foregoing exemplary embodiments are merely exemplary and are not to be construed as limiting. The present teaching can be readily applied to other types of apparatuses. Also, the description of the exemplary embodiments is intended to be illustrative, and not to limit the scope of the claims, and many alternatives, modifications, and variations will be apparent to those skilled in the art.

What is claimed is:

1. A light-emitting device comprising:
   a reflective layer comprising a plurality of nanostructures;
   a first electrode disposed on the reflective layer;
   an organic light emission layer disposed on the first electrode; and
   a second electrode disposed on the organic light emission layer,
   wherein the reflective layer and the second electrode constitute a micro cavity having a resonance wavelength,
   wherein the organic light emission layer comprises a first organic light emission material layer configured to generate a first light of a first wavelength, a second organic light emission material layer configured to generate a second light of a second wavelength different from the first wavelength, and a third organic light emission material layer configured to generate a third light of a third wavelength different from the first and the second wavelengths,
   wherein the first organic light emission material layer is disposed at a position of a first antinode of the resonance wavelength, and
   wherein the second organic light emission material layer and the third organic light emission material layer are disposed at a position of a second antinode of the resonance wavelength resonating in the micro cavity.

2. The light-emitting device of claim 1, wherein the second organic light emission material layer and the third organic light emission material layer are adjacent to or mixed with each other to enable energy transfer from a second light-emitting dopant material in the second organic light emission material layer to a third light-emitting dopant material in the third organic light emission material layer.

3. The light-emitting device of claim 2, wherein the second organic light emission material layer is spaced apart from the first organic light emission material layer between the first organic light emission material layer and the third organic light emission material layer and is arranged in direct contact with the third organic light emission material layer.

4. The light-emitting device of claim 3, wherein the organic light emission layer further comprises:
   a hole injection layer located between the first electrode and the third organic light emission material layer;
   a charge generation layer located between the first organic light emission material layer and the second organic light emission material layer; and
   an electron injection layer located between the first organic light emission material layer and the second electrode.

5. The light-emitting device of claim 2, wherein the second light-emitting dopant material in the second organic light emission material layer and the third light-emitting dopant material in the third organic light emission material layer are phosphorescent dopant materials, and a first light-emitting dopant material in the first organic light emission material layer is a fluorescent dopant material.

6. The light-emitting device of claim 2, wherein the organic light emission layer further comprises a mixture layer of the second organic light emission material layer and the third organic light emission material layer between the second organic emission material layer and the third organic emission material layer.

7. The light-emitting device of claim 2, wherein the third organic light emission material layer is partially mixed with the second organic light emission material layer to form a mixture layer, and the mixture layer is below the second organic light emission material layer.

8. The light-emitting device of claim 2, wherein the organic light emission layer comprises a plurality of second organic light emission material layers and a plurality of third organic light emission material layers that are alternately arranged in a direction from the second electrode toward the first electrode.

9. The light-emitting device of claim 8, wherein a thickness of each of the second organic light emission material layers is greater than a thickness of each of the third organic light emission material layers.

10. The light-emitting device of claim 2, wherein a concentration of the second light-emitting dopant material in the second organic light emission material layer is higher than a concentration of the third light-emitting dopant material in the third organic light emission material layer.

11. The light-emitting device of claim 1, wherein the organic light emission layer further comprises an additional first organic light emission material layer arranged at a position of a third antinode of the resonance wavelength.

12. The light-emitting device of claim 11, wherein the organic light emission layer further comprises a charge generating layer disposed between the additional first organic light emission material layer and the third organic light emission material layer.

13. The light-emitting device of claim 1, wherein a width of each of the plurality of nanostructures of the reflective layer, a height of each of the plurality of nanostructures, and a period of the plurality of nanostructures are set such that the resonance wavelength of the micro cavity coincides with the second wavelength or the third wavelength.

14. The light-emitting device of claim 13, wherein the period of the plurality of nanostructures is smaller than the resonance wavelength of the micro cavity.

15. The light-emitting device of claim 1, wherein the first electrode is a transparent electrode, and the second electrode is a semi-transmissive electrode that reflects a part of light and transmits a remaining part of the light.

16. A display apparatus comprising:
a first pixel configured to emit a first light of a first wavelength;
a second pixel configured to emit a second light of a second wavelength different from the first wavelength; and
a third pixel configured to emit a third light of a third wavelength different from the first and second wavelengths,
wherein at least one of the first, the second, and the third pixels comprises:
a reflective layer comprising a plurality of nanostructures;
a first electrode disposed on the reflective layer;
an organic light emission layer disposed on the first electrode; and
a second electrode disposed on the organic light emission layer,
wherein, when the at least one of the first, the second, and the third pixels comprises the second pixel, the reflective layer and the second electrode that are included in the second pixel, constitute a micro cavity resonating the second light of the second wavelength,
wherein the organic light emission layer comprises a first organic light emission material layer configured to generate the first light of the first wavelength, a second organic light emission material layer configured to generate the second light of the second wavelength, and a third organic light emission material layer configured to generate the third light of the third wavelength,
wherein the first organic light emission material layer is disposed at a position of a first antinode of a resonance wavelength resonating in the micro cavity, and
wherein the second organic light emission material layer and the third organic light emission material layer are disposed at a position of a second antinode of the resonance wavelength.

17. The display apparatus of claim 16, further comprising the third pixel,
wherein the reflective layer and the second electrode that are included in the third pixel, constitute a third micro cavity resonating the third light of the third wavelength.

18. The display apparatus of claim 17, further comprising the first pixel
wherein the reflective layer and the second electrode that are included in the first pixel, constitute a first micro cavity resonating the first light of the first wavelength.

19. The display apparatus of claim 18, further comprising the first pixel, the second pixel, and the third pixel,
wherein a physical thickness of the first pixel, a physical thickness of the second pixel, and a physical thickness of the third pixel are equal to each other.

20. A display apparatus comprising a plurality of pixels, wherein at least one of the plurality of pixels comprises:
an organic light emission layer disposed between a first electrode and a second electrode, and comprising:
a first organic light emission material layer comprising a first light-emitting dopant material, without a second light-emitting dopant material and a third light-emitting dopant material;
a second organic light emission material layer comprising the second light-emitting dopant material, without the first light-emitting dopant material and the third light-emitting dopant material;
a third organic light emission material layer comprising the third light-emitting dopant material without the first light-emitting dopant material and the second light-emitting dopant material; and
a mixture layer that is formed by the second light-emitting dopant material being mixed with the third light-emitting dopant material when the second organic light emission material layer is directly in contact with the third organic light emission material layer, and that is disposed between the second organic light emission material layer and the third organic light emission material layer, and
a reflective layer which comprises a plurality of nanostructures, and on which the first electrode, the organic light emission layer, and the second electrode are disposed.

* * * * *